US007709367B2

(12) United States Patent
Lee et al.

(10) Patent No.: US 7,709,367 B2
(45) Date of Patent: May 4, 2010

(54) METHOD FOR FABRICATING STORAGE NODE CONTACT IN SEMICONDUCTOR DEVICE

(75) Inventors: Hae-Jung Lee, Kyoungki-do (KR); Ik-Soo Choi, Kyoungki-do (KR); Chang-Youn Hwang, Kyoungki-do (KR); Mi-Hyune You, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 364 days.

(21) Appl. No.: 11/761,577

(22) Filed: Jun. 12, 2007

(65) Prior Publication Data

US 2008/0003811 A1 Jan. 3, 2008

(30) Foreign Application Priority Data

Jun. 30, 2006 (KR) ...................... 10-2006-0060056
Apr. 18, 2007 (KR) ...................... 10-2007-0037837

(51) Int. Cl.
*H01L 21/44* (2006.01)

(52) U.S. Cl. ...................... 438/597; 438/254; 438/255; 438/397; 438/398; 438/673; 438/672; 438/637; 438/638; 257/304; 257/311; 257/365; 257/E21.649; 257/E27.086; 257/E27.089; 257/E27.132; 257/E27.097; 257/906; 257/912

(58) Field of Classification Search ................ 438/254, 438/255, 397, 398; 257/304, 311, 365, E21.649, 257/E27.086, E27.089, E27.132, E31.097, 257/906, 912
See application file for complete search history.

(56) References Cited

U.S. PATENT DOCUMENTS

| | | | | |
|---|---|---|---|---|
| 5,180,689 | A * | 1/1993 | Liu et al. | 438/640 |
| 5,500,080 | A * | 3/1996 | Choi | 438/639 |
| 5,502,006 | A * | 3/1996 | Kasagi | 438/624 |
| 5,595,929 | A * | 1/1997 | Tseng | 438/397 |
| 5,622,883 | A * | 4/1997 | Kim | 438/396 |
| 5,629,237 | A * | 5/1997 | Wang et al. | 438/701 |
| 5,780,339 | A * | 7/1998 | Liu et al. | 438/253 |
| 5,821,141 | A * | 10/1998 | Huang | 438/253 |
| 5,851,928 | A * | 12/1998 | Cripe et al. | 438/748 |
| 6,228,762 | B1 * | 5/2001 | Park | 438/639 |
| 6,239,025 | B1 * | 5/2001 | Bease et al. | 438/637 |

(Continued)

FOREIGN PATENT DOCUMENTS

KR 2000-0013396 A 3/2000

(Continued)

*Primary Examiner*—Fernando L Toledo
*Assistant Examiner*—Ankush K Singal
(74) *Attorney, Agent, or Firm*—Blakely, Sokoloff, Taylor & Zafman LLP

(57) ABSTRACT

A method for fabricating a storage node contact in a semiconductor device includes forming a landing plug over a substrate, forming a first insulation layer over the landing plug, forming a bit line pattern over the first insulation layer, forming a second insulation layer over the bit line pattern, forming a mask pattern for forming a storage node contact over the second insulation layer, etching the second and first insulation layers until the landing plug is exposed to form a storage node contact hole including a portion having a rounded profile, filling a conductive material in the storage node contact hole to form a contact plug, and forming a storage node over the contact plug.

16 Claims, 6 Drawing Sheets

44 43A 40C 36A 35 32 33 31

(A)

38 37 BL' 39 35 34 31

(B)

U.S. PATENT DOCUMENTS 6,251,742 B1 * 6/2001 Lin ............................ 438/396
6,294,476 B1 * 9/2001 Lin et al. .................... 438/725
6,316,803 B1 * 11/2001 Ban et al. ................... 257/311
6,331,462 B1 * 12/2001 Kasaoka et al. ............. 438/253
6,348,375 B1 * 2/2002 Lee et al. .................... 438/253
6,352,896 B1 * 3/2002 Liu et al. .................... 438/253
6,355,557 B2 * 3/2002 Stinnett et al. .............. 438/640
6,461,911 B2 * 10/2002 Ahn et al. ................... 438/253
6,649,508 B1 * 11/2003 Park et al. ................... 438/618
6,708,405 B2 * 3/2004 Hasler et al. .................. 29/852
6,759,704 B2 * 7/2004 Park ........................... 257/306
6,794,757 B1 * 9/2004 Smith ......................... 257/764
6,815,823 B2 * 11/2004 Teh et al. .................... 257/758
6,881,659 B2 * 4/2005 Park et al. ................... 438/618
6,916,738 B2 * 7/2005 Lee et al. .................... 438/639
6,939,794 B2 * 9/2005 Yin et al. .................... 438/624
6,952,028 B2 * 10/2005 Lee et al. .................... 257/295
6,967,150 B2 * 11/2005 Yun et al. ................... 438/586
7,030,439 B2 * 4/2006 Yun et al. ................... 257/296
7,078,292 B2 * 7/2006 Park et al. ................... 438/250
7,126,180 B2 * 10/2006 Park ........................... 257/303
7,208,367 B2 * 4/2007 Kim et al. ................... 438/239
7,321,146 B2 * 1/2008 Yun et al. ................... 257/300
7,361,550 B2 * 4/2008 Kim ........................... 438/253
7,547,938 B2 * 6/2009 Yun et al. ................... 257/303
2002/0027288 A1 * 3/2002 Lee et al. .................... 257/758
2002/0055222 A1 * 5/2002 Kim et al. ................... 438/239
2002/0058371 A1 * 5/2002 Ohuchi ....................... 438/200
2002/0130343 A1 * 9/2002 Horiba ....................... 257/296
2002/0196653 A1 * 12/2002 Kim et al. ................... 365/100
2004/0048475 A1 * 3/2004 Hong et al. ................. 438/689
2004/0124455 A1 * 7/2004 Lee et al. .................... 257/295
2004/0149992 A1 * 8/2004 Park et al. ..................... 257/71
2004/0161918 A1 * 8/2004 Yun ........................... 438/618
2004/0164328 A1 * 8/2004 Lee et al. .................... 257/213
2004/0178433 A1 * 9/2004 Yun et al. ................... 257/298
2004/0180494 A1 * 9/2004 Hwang et al. ............... 438/254
2004/0188806 A1 * 9/2004 Chung et al. ................ 257/621
2004/0191930 A1 * 9/2004 Son et al. ....................... 438/3
2004/0266101 A1 * 12/2004 Park et al. ................... 438/253
2005/0003646 A1 * 1/2005 Park et al. ................... 438/586
2005/0035387 A1 * 2/2005 Lee et al. .................... 257/296
2005/0054189 A9 * 3/2005 Kim et al. ................... 438/622
2005/0167724 A1 * 8/2005 Choi et al. .................. 257/308
2005/0186733 A1 * 8/2005 Yun et al. ................... 438/254
2005/0218439 A1 * 10/2005 Lee et al. .................... 257/296
2006/0040454 A1 * 2/2006 Park et al. ................... 438/315
2006/0261392 A1 * 11/2006 Lee et al. .................... 257/296
2007/0123040 A1 * 5/2007 Hwang et al. ............... 438/672
2007/0184625 A1 * 8/2007 Park ........................... 438/381
2007/0218682 A1 * 9/2007 Lee et al. .................... 438/639
2008/0088025 A1 * 4/2008 Yun et al. ................... 257/758

FOREIGN PATENT DOCUMENTS

KR 10-2005-0106865 11/2005
KR 10-2006-0114431 A 11/2006
KR 10-2007-0001487 1/2007

* cited by examiner

METHOD FOR FABRICATING STORAGE NODE CONTACT IN SEMICONDUCTOR DEVICE

CROSS-REFERENCES TO RELATED APPLICATIONS

The present invention claims priority of Korean patent application numbers 10-2006-0060056 and 10-2007-0037837, filed on Jun. 30, 2006 and Apr. 18, 2007, respectively, which are incorporated by reference in their entirety.

BACKGROUND OF THE INVENTION

The present invention relates to a method for fabricating a semiconductor device, and more particularly, to a method for fabricating a storage node contact in a semiconductor device.

As semiconductor devices become highly integrated, a contact margin between a storage node contact plug and a storage node have decreased, generating limitations such as misalignment. Thus, a storage node contact pad having a large line width is formed over the storage node contact plug to maintain the contact margin between the storage node contact plug and the storage node.

FIGS. 1A to 1E illustrate cross-sectional views of a typical method for fabricating a storage node contact in a semiconductor device. Reference denotation (A) represents a sectional view of a cell region taken along a bit line direction, and reference denotation (B) represents a sectional view of the cell region taken along a word line direction.

Referring to FIG. 1A, a plurality of gate lines 12 are formed over a substrate 11. Sidewall spacers 13 are formed on sidewalls of the gate lines 12. A first insulation layer is formed over the substrate structure. A landing plug contact process is then performed to form landing plugs 15 between adjacent gate lines 12 over the substrate 11. Reference numeral 14 refers to a first insulation pattern 14.

A second insulation layer 16 is formed over the resultant structure. Bit lines BL are formed over certain regions of the second insulation layer 16. The bit lines BL each include a stack structure configured with a bit line tungsten layer 17 and a bit line hard mask 18. Bit line spacers 19 are formed on sidewalls of the bit lines BL. A third insulation layer 20 is formed over the resultant structure. A hard mask layer is formed over the third insulation layer 20. The hard mask layer is etched using a photoresist pattern 22 to form a hard mask pattern 21.

Referring to FIG. 1B, the photoresist pattern 22 is removed. The third insulation layer 20 and the second insulation layer 16 are etched using the hard mask pattern 21 as an etch barrier to form first contact holes 23 exposing the landing plugs 15. The exposed portions of the landing plugs 15 will be coupled to subsequent storage nodes. Reference numerals 16A and 20A refer to a second insulation pattern 16A and a third insulation pattern 20A, respectively.

Referring to FIG. 1C, spacers 24 are formed in the first contact holes 23 (FIG. 1B). A conductive material is filled in the first contact holes 23. An etch-back or chemical mechanical polish (CMP) process is performed to form storage node contact plugs 25 in the first contact holes 23. The hard mask pattern 21 is removed during the etch-back or CMP process.

Referring to FIG. 1D, a fourth insulation layer 26 is formed over the resultant structure. A mask pattern 27 is formed over certain regions of the fourth insulation layer 26. The mask pattern 27 is formed to form subsequent contact pads having a larger line width than the storage node contact plugs 25.

Referring to FIG. 1E, the fourth insulation layer 26 is etched using the mask pattern 27 (FIG. 1D) as an etch barrier to form second contact holes (reference numeral omitted) exposing the storage node contact plugs 25. Reference numeral 26A refers to a fourth insulation pattern 26A. A conductive material is filled in the second contact holes to form storage node contact pads 28. Subsequent storage nodes will be coupled to the storage node contact pads 28.

In the aforementioned typical method, the storage node contact plugs 25 and the storage node contact pads 28 are formed to improve a process margin when forming subsequent storage node contacts. However, the mask and etch processes for forming the storage node contact plugs 25 and the mask and etch processes for forming the storage node contact pads 28 are performed separately. Thus, two sets of mask patterns and etch processes are often required. The increased number of processes may generate limitations such as increased cost of device fabrication process and deteriorated yield.

SUMMARY OF THE INVENTION

Embodiments of the present invention are directed to a method for fabricating a storage node contact in a semiconductor device, which can improve a contact margin by performing a simplified process using one mask.

In accordance with an aspect of the present invention, there is provided a method for fabricating a storage node contact in a semiconductor device, including: forming a landing plug over a substrate; forming a first insulation layer over the landing plug; forming a bit line pattern over the first insulation layer; forming a second insulation layer over the bit line pattern; forming a mask pattern for forming a storage node contact over the second insulation layer; etching the second and first insulation layers until the landing plug is exposed to form a storage node contact hole including a portion having a rounded profile; filling a conductive material in the storage node contact hole to form a contact plug; and forming a storage node over the contact plug.

DESCRIPTION OF SPECIFIC EMBODIMENTS

Embodiments of the present invention relate to a method for fabricating a storage node contact in a semiconductor device. According to this embodiment, a contact plug including an upper portion having a rounded profile with a large width and a bottom portion having a vertical profile with a small bottom width, e.g., a wine glass-like shape, is formed such that a storage node contact area is sufficiently secured to maintain a sufficient contact process margin. Also, a plug which can secure a contact area is formed by performing a single mask process to reduce the number of processes. Thus, fabrication cost may be decreased.

FIGS. 2A to 2F illustrate cross-sectional views of a method for fabricating a storage node contact in a semiconductor device in accordance with an embodiment of the present invention. Reference denotation (A) represents a sectional view of a cell region taken along a bit line direction, and reference denotation (B) represents a sectional view of the cell region taken along a word line direction.

Figure 1A:
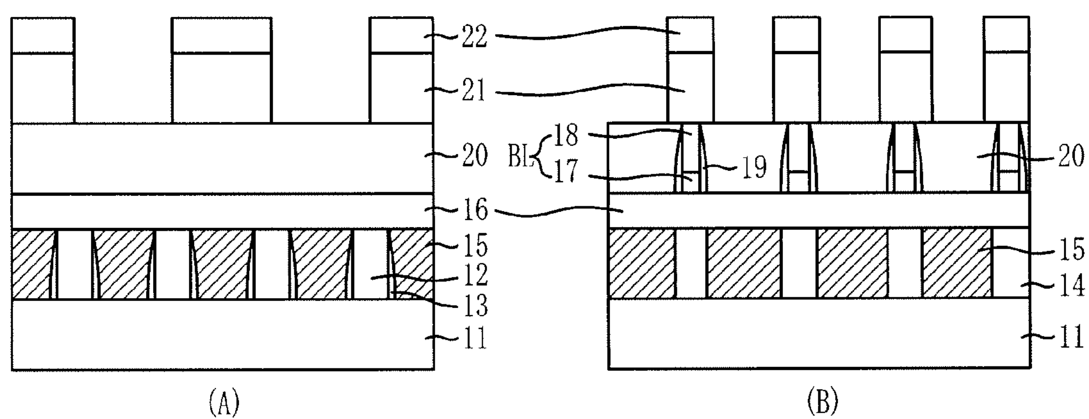
FIGS. 1A to 1E illustrate cross-sectional views of a typical method for fabricating a storage node contact hole in a semiconductor device.
Figure 1B:
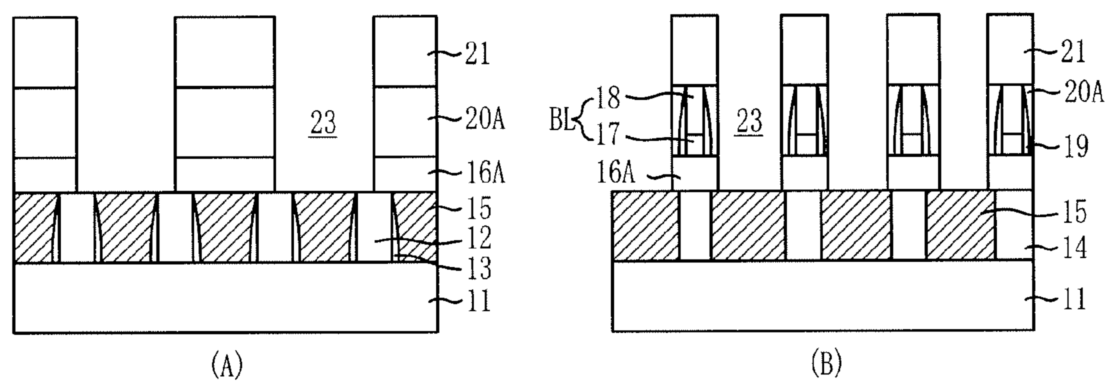
Figure 1C:
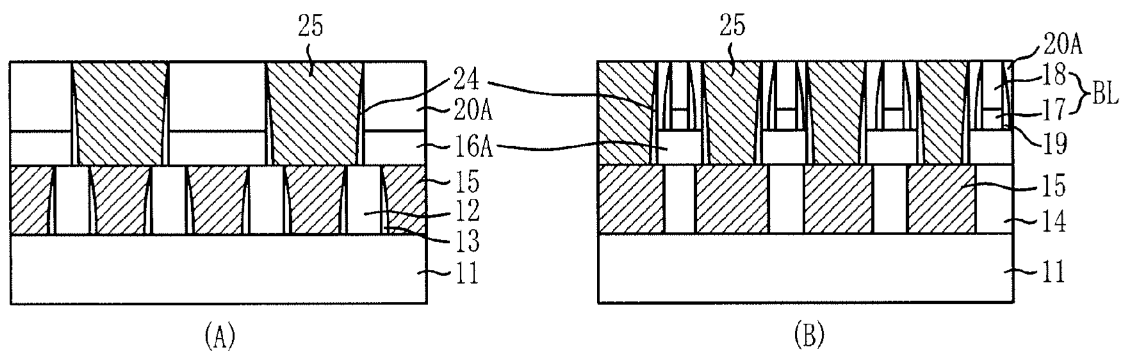
Figure 1D:
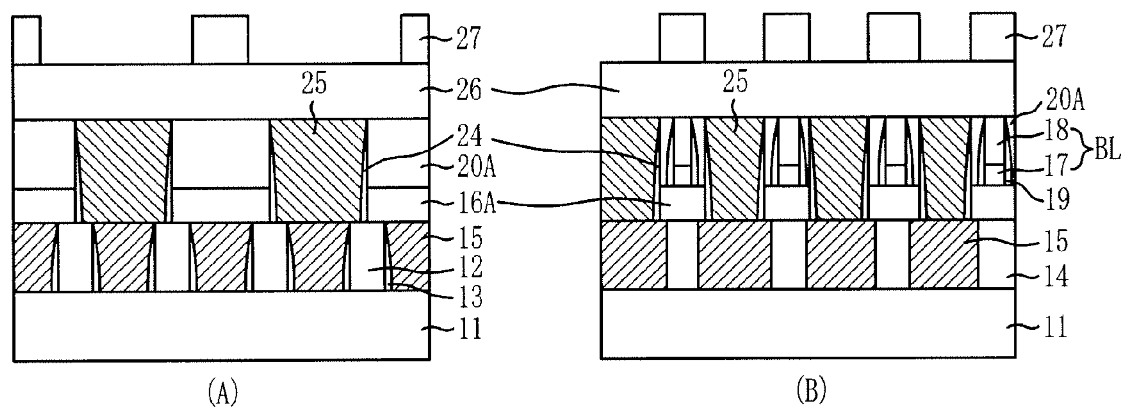
Figure 1E:
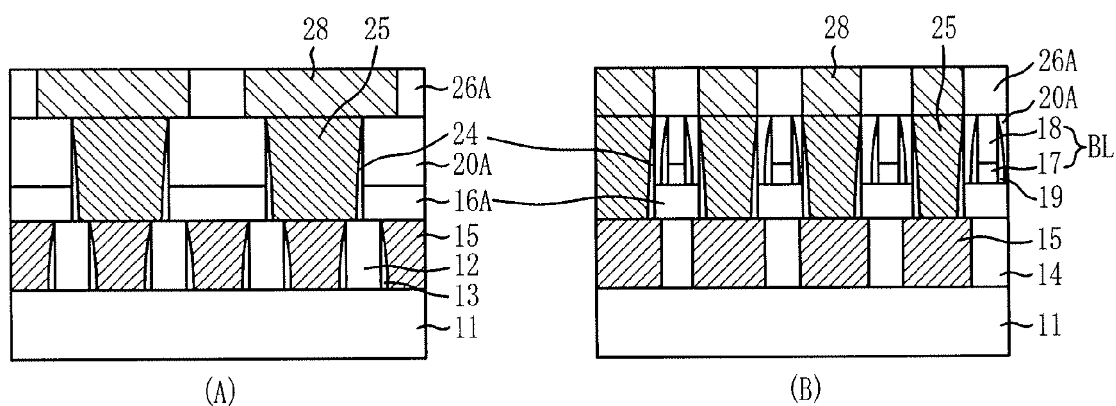
Figure 2A:
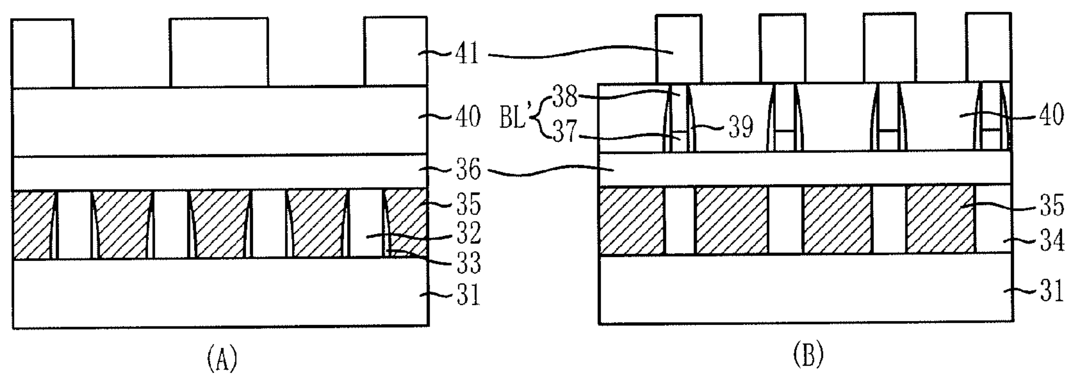
FIGS. 2A to 2F illustrate cross-sectional views of a method for fabricating a storage node contact hole in a semiconductor device in accordance with an embodiment of the present invention.

Referring to FIG. 2A, a plurality of gate lines 32 are formed over a semi-finished substrate 31. Although not shown, the semi-finished substrate 31 includes wells and isolation structures. Gate spacers 33 are formed on both sidewalls of the gate lines 32. A first insulation layer is formed over the resultant structure. The first insulation layer is etched to form landing contact holes for forming landing plug contacts. A conductive material is filled in the landing contact holes to form landing plugs 35. The conductive material may include a polysilicon layer. The etched first insulation layer is referred to as a first insulation pattern 34.

A second insulation layer 36 is formed over the resultant structure. Bit lines BL' are formed over certain regions of the second insulation layer 36. The bit lines BL' each include a stack structure configured with a tungsten layer 37 for forming a bit line electrode and a bit line hard mask 38. Bit line spacers 39 are formed on both sidewalls of the bit lines BL'.

A third insulation layer is formed over the resultant structure. A CMP process is performed on the third insulation layer for planarization until the bit line hard masks 38 are exposed and the polished third insulation layer is flush with the bit line hard masks 38. The polished third insulation layer is referred to as a third insulation pattern 40. A mask pattern 41 for performing storage node contact etching is formed over certain regions of the third insulation pattern 40. The mask pattern 41 may be a hard mask including amorphous carbon or a polysilicon layer. Also, a photoresist pattern may be used as the mask pattern 41. In this embodiment, a hard mask including amorphous carbon is applied. The mask pattern 41 may be patterned in an elliptical trench type, and not in a line type, to reduce damage on the bit line hard masks 38.

Figure 2B:
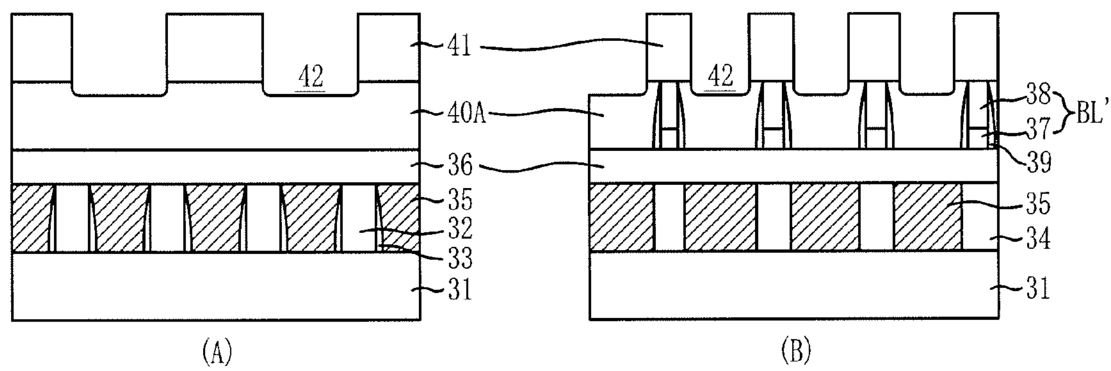

Referring to FIG. 2B, portions of the third insulation pattern 40 are etched to a certain depth using the mask pattern 41 as an etch barrier to form recesses 42. For instance, the portions of the third insulation pattern 40 are dry etched. Etching the third insulation pattern 40 comprises using a typical self-aligned contact hole etch technique to prevent short-circuit with the bit lines BL'. Also, etching the third insulation pattern 40 comprises using an etch gas having a low ratio of fluorine to carbon. For instance, the etch gas may include $C_4F_8$, $C_5F_8$, or $C_4F_6$. The third insulation pattern 40 is etched to the certain depth in a manner that the second insulation layer 36 is not exposed during a subsequent wet etch process. Reference numeral 40A refers to a recessed third insulation pattern 40A.

Figure 2C:
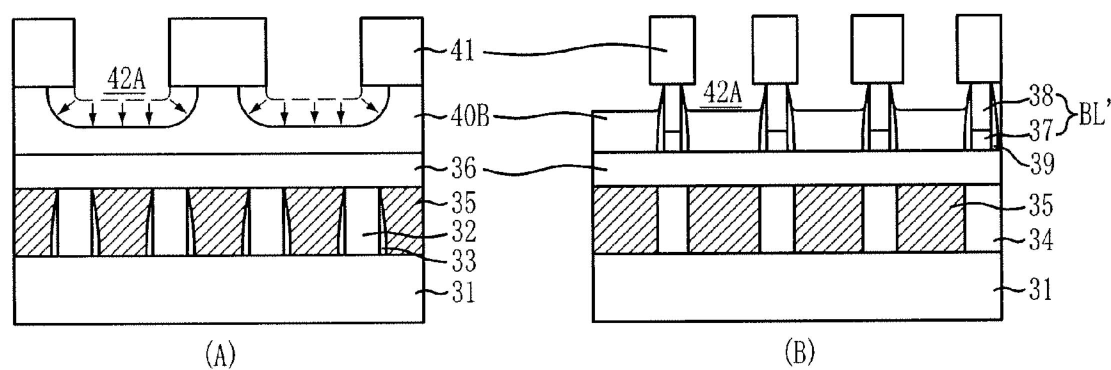

Referring to FIG. 2C, a wet etch process is performed using the mask pattern 41 as an etch barrier to form open regions 42A having a larger line width than the recesses 42 (FIG. 2B). At this time, the open regions 42A have an increased depth and the increased line width when compared to the recesses 42. This result is obtained because the wet etch process has an anisotropic etch characteristic that etches in all directions to a certain depth. The wet etch process includes using a diluted hydrogen fluoride (HF) solution. The wet etch process is performed in a manner that the bit line electrodes are not exposed. That is, the second insulation layer 36 may not be wet etched. Also, the wet etch process may be performed sideways in a manner that the adjacent open regions 42A are not connected. Reference numeral 40B refers to a wet etched third insulation pattern 40B.

Figure 2D:
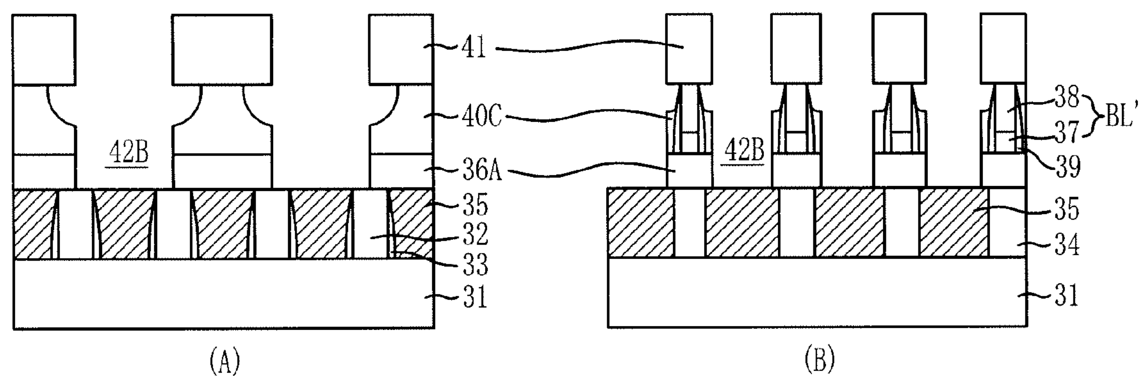

Referring to FIG. 2D, portions of the wet etched third insulation pattern 40B and the second insulation layer 36 below the open regions 42A are dry etched using the mask pattern 41 as an etch barrier to form storage node contact holes 42B. The storage node contact holes 42B expose upper portions of the landing plugs 35. The storage node contact holes 42B include an upper portion having a rounded profile with a large width and a bottom portion having a vertical profile with a small width. For instance, the storage node contact holes 42B may be formed to have a wine glass-like shape. The dry etching for forming the storage node contact holes 42B comprises using a typical self-aligned contact hole etch technique and using an etch gas having a low ratio of fluorine to carbon. For instance, the etch gas may include $C_4F_8$, $C_5F_8$, or $C_4F_6$. Reference numerals 40C and 36A refer to a remaining third insulation pattern 40C and a second insulation pattern 36A, respectively.

Figure 2E:
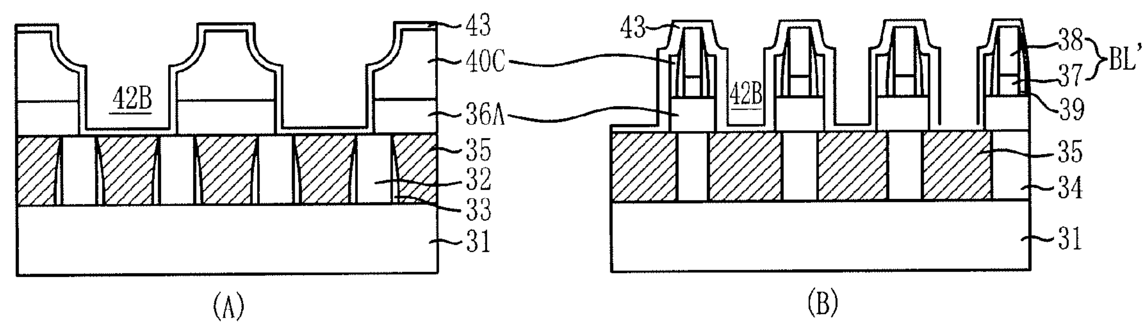

Referring to FIG. 2E, the mask pattern 41 is removed and a spacer insulation layer 43 is then formed over surfaces of the storage node contact holes 42B. For instance, the spacer insulation layer 43 may include a nitride-based layer.

Figure 2F:
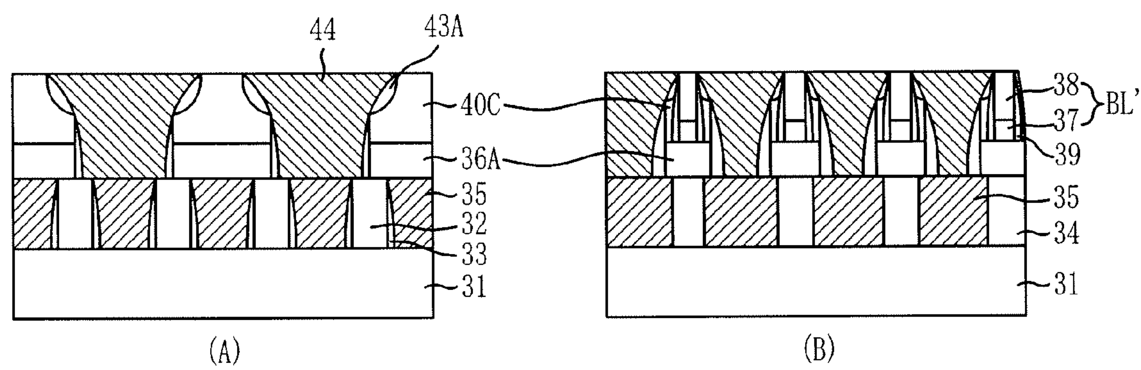

Referring to FIG. 2F, an over etch-back process is performed on the spacer insulation layer 43 to form storage node contact spacers 43A on both sidewalls of the storage node contact holes 42B. A conductive material is filled in the storage node contact holes 42B to form storage node contact plugs 44. For instance, the conductive material includes polysilicon.

According to the embodiment of the present invention, storage node contacts may be embodied without forming storage node contact pads over the storage node contact plugs 44. This result may be obtained because the storage node contact plugs 44 include an upper portion having a rounded profile with a large width when compared to a typical plug.

While the present invention has been described with respect to the specific embodiments, it will be apparent to those skilled in the art that various changes and modifications may be made without departing from the spirit and scope of the invention as defined in the following claims.

What is claimed is:

1. A method of fabricating a storage node contact in a semiconductor device, the method comprising:

forming a landing plug over a substrate;

forming a first insulation layer over the landing plug;

forming a bit line pattern over the first insulation layer;

forming a second insulation layer over the bit line pattern;

forming a mask pattern to form the storage node contact over the second insulation layer;

etching only the second and first insulation layers until the landing plug is exposed to form a storage node contact hole including a portion having a rounded profile, wherein said etching includes performing a plurality of etching processes, and wherein performing the plurality of etching processes includes performing an etching process that exposes the landing plug which includes performing a first dry etching process and a wet etching process to etch through a first portion of the second insulation layer over the landing plug to a depth which is less than a thickness of the second insulation layer such that a second portion of the second insulation layer remains over the entire landing plug and performing a second dry etching process to etch through the second portion of the second insulation layer and the first insulation layer over the landing plug;

filling a conductive material in the storage node contact hole to form a contact plug; and forming a storage node over the contact plug.

2. The method of claim 1, wherein forming the mask pattern comprises forming the mask pattern in an elliptical trench type.

3. The method of claim 1, wherein the bit line pattern comprises a bit line having a stack structure including a bit line electrode and a hard mask and first insulation spacers formed on sidewalls of the bit line.

4. The method of claim 1, wherein the mask pattern comprises an amorphous carbon hard mask.

5. The method of claim 1, further comprising, after etching only the second and first insulation layers to form the storage node contact hole, forming second insulation spacers on sidewalls of the storage node contact hole.

6. The method of claim 1, wherein the conductive material comprises polysilicon.

7. The method of claim 1, wherein etching only the second and first insulation layers until the landing plug is exposed comprises performing a wet etch that etches only part way through the second insulation layer.

8. The method of claim 1, wherein a top of the second insulation layer is formed coplanar with a top of the bit line pattern.

9. The method of claim 1, wherein etching only the second and first insulation layers to form the storage node contact hole including the portion having the rounded profile comprises using only the single mask pattern.

10. The method of claim 1, wherein etching only the second and first insulation layers to form the storage node contact hole comprises etching the second and first insulation layers to form the storage node contact hole to have a wine glass-like shape.

11. The method of claim 3, wherein the second insulation layer is planarized in a manner that the second insulation layer is flush with the hard mask of the bit line pattern.

12. The method of claim 1, wherein the storage node contact hole including the portion having the rounded profile comprises an upper portion having the rounded profile with a large width and a bottom portion having a vertical profile with a small width.

13. The method of claim 1, wherein performing the first dry etch process and the second dry etch process comprises using an etch gas having a low ratio of fluorine to carbon.

14. The method of claim 1, wherein performing the wet etch process comprises using a diluted hydrogen fluoride (HF) solution.

15. The method of claim 1, wherein the bit line pattern comprises a bit line having a stack structure including a bit line electrode and a hard mask and first insulation spacers formed on sidewalls of the bit line, and wherein the wet etch process is performed in a manner that the bit line electrode is not exposed.

16. The method of claim 13, wherein the etch gas comprises $C_4F_8$, $C_5F_8$, or $C_4F_6$.

* * * * *